United States Patent [19]
Scott et al.

[11] Patent Number: 5,549,746
[45] Date of Patent: Aug. 27, 1996

[54] SOLID STATE THERMAL CONVERSION OF POLYCRYSTALLINE ALUMINA TO SAPPHIRE USING A SEED CRYSTAL

[75] Inventors: Curtis E. Scott, Mentor; Jack M. Strok, Garrettsville, both of Ohio; Lionel M. Levinson, Schenectady, N.Y.

[73] Assignee: General Electric Company, Schenectady, N.Y.

[21] Appl. No.: 126,628

[22] Filed: Sep. 24, 1993

[51] Int. Cl.$^6$ ................................. C30B 33/02
[52] U.S. Cl. ........................ 117/4; 117/1; 117/950
[58] Field of Search ................... 117/1, 4, 7, 10, 117/23, 25, 49, 920, 924, 950; 313/220, 227

[56] References Cited

U.S. PATENT DOCUMENTS

| | | | |
|---|---|---|---|
| 3,026,210 | 3/1962 | Coble | 117/25 |
| 3,564,328 | 2/1971 | Bagtey et al. | 313/220 |
| 3,591,348 | 7/1971 | Labelle, Jr. | 117/25 |
| 3,943,324 | 3/1976 | Haggerty | 117/23 |
| 3,998,686 | 12/1976 | Meiling et al. | 156/617.1 |
| 4,150,317 | 4/1979 | Laska et al. | 313/221 |
| 4,980,236 | 12/1990 | Oomen et al. | 428/469 |

FOREIGN PATENT DOCUMENTS 6228118 6/1987 Japan.

Primary Examiner—R. Bruce Breneman
Assistant Examiner—Felisa Garrett
Attorney, Agent, or Firm—Stanley C. Corwin

[57] ABSTRACT

A solid state seed crystal process for bulk conversion of a polycrystalline ceramic body to a single crystal body (of the same chemical composition) having the same crystal orientation as the seed crystal. The process comprises heating said body to form a monolithic join between the body and the seed crystal, heating the joined structure to reduce grain growth inhibitors and further heating the joined structure above the minimum temperature required for crystallite growth of the crystalline material, but not hot enough to melt and distort the original shape of the polycrystalline ceramic body during its conversion to a single crystal. This process has been used to convert polycrystalline alumina (PCA) bodies to sapphire having the same crystal orientation as the seed crystal by heating the PCA body, monolithically joined to a sapphire seed crystal, at a temperature above 1700° C. without melting the body.

12 Claims, 3 Drawing Sheets

SOLID STATE THERMAL CONVERSION OF POLYCRYSTALLINE ALUMINA TO SAPPHIRE USING A SEED CRYSTAL

BACKGROUND OF THE INVENTION

1. Related Applications

This application is related to copending applications entitled "Solid State Formation of Sapphire Using a Localized Energy Source", Ser. No. 08/064,386 (LD 10498), filed May 21, 1993; "Solid State Thermal Conversion of Polycrystalline Alumina to Sapphire", Ser. No. 08/126,954 (LD 10326), filed Sep. 24, 1993; and "Conversion of Polycrystalline Material to Single Crystal Material Using Bodies Having a Selected Surface Topography", Ser. No. 08/126, 830 (RD-21,373), filed Sep. 24, 1993, the latter two applications filed concurrently herewith, all of which are assigned to the assignee of the present invention. This application is also related to copending application entitled "Conversion of Doped Polycrystalline Material to Single Crystal", Ser. No. 08/195,187 (RD 23,156), filed Feb. 14, 1994.

2. Field of the Invention

This invention relates to a solid state process for bulk conversion of a polycrystalline alumina (PCA) body to sapphire using a sapphire seed crystal monolithically joined to the PCA body and heating said body to a temperature above 1100° C., but below the approximately 2050° C. melting temperature for alpha alumina for a time sufficient to convert the PCA body to sapphire having the same crystal orientation as the seed crystal.

3. Background of the Disclosure

The manufacture of polycrystalline alumina (PCA), and its use for high pressure sodium arc discharge lamps (hereinafter "HPS lamps") is well known and old to those skilled in the art. U.S. Pat. Nos. 3,026,210, 4,150,317 and 4,285, 732, respectively, to Coble, Laska et al and Charles et al, disclose the production of a high density PCA body having improved visible light transmission using relatively pure alumina powder and small amounts of magnesia. U.S. Pat. No. 4,285,732 further teaches adding zirconia and hafnia to the magnesia-doped alumina to reduce the chances of precipitating a spinel phase and exaggerated or run away grain growth during sintering. PCA bodies useful as arc tubes for HPS lamps have been made according to the processes in these patents having an average grain size ranging from between 15 microns to 100 microns.

Two major drawbacks associated with the use of PCA arc tubes for HPS lamps are that they are light translucent as opposed to light transparent and the sodium in the arc reacts with the alumina at the grain boundaries to form sodium aluminate, which shortens lamp life. HPS lamps are being designed for increased internal sodium partial pressure within the PCA arc tube to improve the color rendition and provide white emitted light. However, higher internal sodium pressure further shortens lamp life due to increased rate of sodium loss from the arc chamber. Progressive sodium loss results in a continual rise in the lamp operating voltage, decrease of both correlated color temperature and color rendering index, and a color shift from white to pink. Also, the sodium which migrates through the arc chamber wall deposits on the inside wall of the evacuated outer lamp envelope causing a brownish stain on the envelope which, in turn, further reduces the light output of the lamp. These problems are substantially reduced with sapphire (i.e., single crystal alumina) arc tubes.

Sapphire arc tubes useful as the arc chamber for HPS lamps have been made by a number of processes, including a modified Czochralski process known as the edge-defined, film-fed growth or (EFG) process developed by Tyco Laboratories, Inc. This process uses a seed crystal and a die on the surface of molten alumina where a hollow tube is continuously pulled out of the melt through the die. This process is expensive and slow. Another process used to produce single crystal alumina or sapphire is called the floating zone process in which a PCA feed rod is introduced at a predetermined velocity into a heating zone wherein one or more lasers or other concentrated heat source is focused on the rod to melt the alumina in the zone to produce a "melt volume" of molten alumina. A sapphire fiber is continuously drawn from the melt volume at the desired velocity and the feed rod is moved simultaneously, but at a slower rate so that the process is a continuous one. This process is used primarily to produce sapphire fibers and does not readily lend itself to production of single crystal alumina tubing, although its use for such is disclosed in U.S. Pat. No. 3,943,324. Japanese Patent Publication 62-28118 discloses a furnace process for converting PCA tubes to sapphire tubes, but does not show the use of a monolithically joined seed starter for forming sapphire.

A need exists for producing sapphire from PCA in a facile and relatively inexpensive manner and preferably by means of a solid state process for converting a polycrystalline ceramic article or body to a single crystal without substantial melting of the structure that is being converted, so that the single crystal has substantially the same size and shape as the polycrystalline article. A solid state conversion process would make it possible to manufacture single crystal articles having non-uniform, asymmetric and complex shapes as well as simple shapes. It would also be a great improvement to the art if such a process were cost effective in greatly reducing both the energy and the time required to effect the formation of a single crystal ceramic structure from a polycrystalline ceramic structure.

SUMMARY OF THE INVENTION

The present invention relates to a solid state process for bulk conversion of a polycrystalline ceramic material or body to a single crystal material by heating the polycrystalline material monolithically joined with a single crystal of the same material above the minimum temperature for grain boundary mobility, but below the melting temperature of the ceramic material. By monolithically joined is meant that the polycrystalline material and the single crystal seed have become a single structure with most of the interfacial porosity removed and grain growth across the interface unrestricted. The so-formed single crystal material will have the same shape and size of the polycrystalline ceramic body. By bulk conversion is meant a single crystal front propagating over macroscopic distances (i.e., >50 microns). This process has been found to be particularly useful for converting polycrystalline alumina (PCA) to single crystal alumina (hereinafter "sapphire"). By solid state process is meant that the conversion of the polycrystalline ceramic material or body to single crystal occurs at a temperature below the melting temperature of the polycrystalline material. However, this does not preclude the possibility of slight surface melting during the conversion process. Thus, by employing the solid state conversion process of this invention, prestructured, simple or complex shapes of polycrystalline material can be fabricated and then converted to the corresponding single crystal material with the desired crystal orientation without melting the article to be converted, thereby substantially maintaining the original shape. A Lucalox® polycrystalline alumina body can be converted into a sapphire body using the process of this invention. A partially sintered PCA body is joined to a sapphire seed by heating the assembly above 1100° C. but below approximately 2050° C. (the melting point of alumina). A monolithic join forms as the PCA shrinks onto the sapphire seed and grain growth occurs across the interface.

The joined article is heated again at a temperature above 1100° C. but below the approximate melting point of alumina. Initially this causes the elimination of residual grain growth inhibitors such as MgO and porosity in the seeded PCA structure. The conversion of PCA to sapphire occurs as a solid state reaction with the converted PCA article having the same crystal orientation as the seed crystal.

Further, sapphire produced according to this invention is distinguished from sapphire made by the EFG or Czochralski process in that residual porosity, which is generally less than $10^{-3}$ volume fraction, is completely random compared to the presence of linear pore structures resulting from voids produced by drawing in the other processes. Hollow sapphire tubes useful as arc chambers in HPS lamps have been made according to the practice of this invention.

DETAILED DESCRIPTION

Figure 1A:
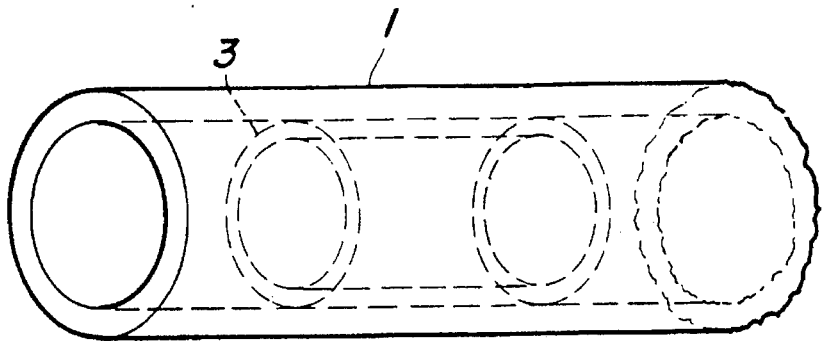
FIGS. 1(a) through 1(e) schematically illustrate varying embodiments of employing a sapphire seed crystal with a partially sintered or bisque fired PCA body in the practice of this invention.

Turning to FIG. 1(a) there is schematically illustrated one end of a presintered PCA compact or bisque-fired body 1 in the form of a hollow tube into which has been inserted a sapphire crystal 3 in the form of a short piece of a hollow tube or a ring having an O.D. such that it will form a monolithic join between it and the I.D. of bisque-fired PCA tube 1 when the bisque-fired PCA shrinks during final sintering. Typically the I.D. of the outer tube shrinks to a final sintered I.D. which is 1–10% smaller than the O.D. of the seed crystal 3. This allows for a monolithic join between the PCA and the sapphire seed as shown in FIG. 2.

Figure 2:
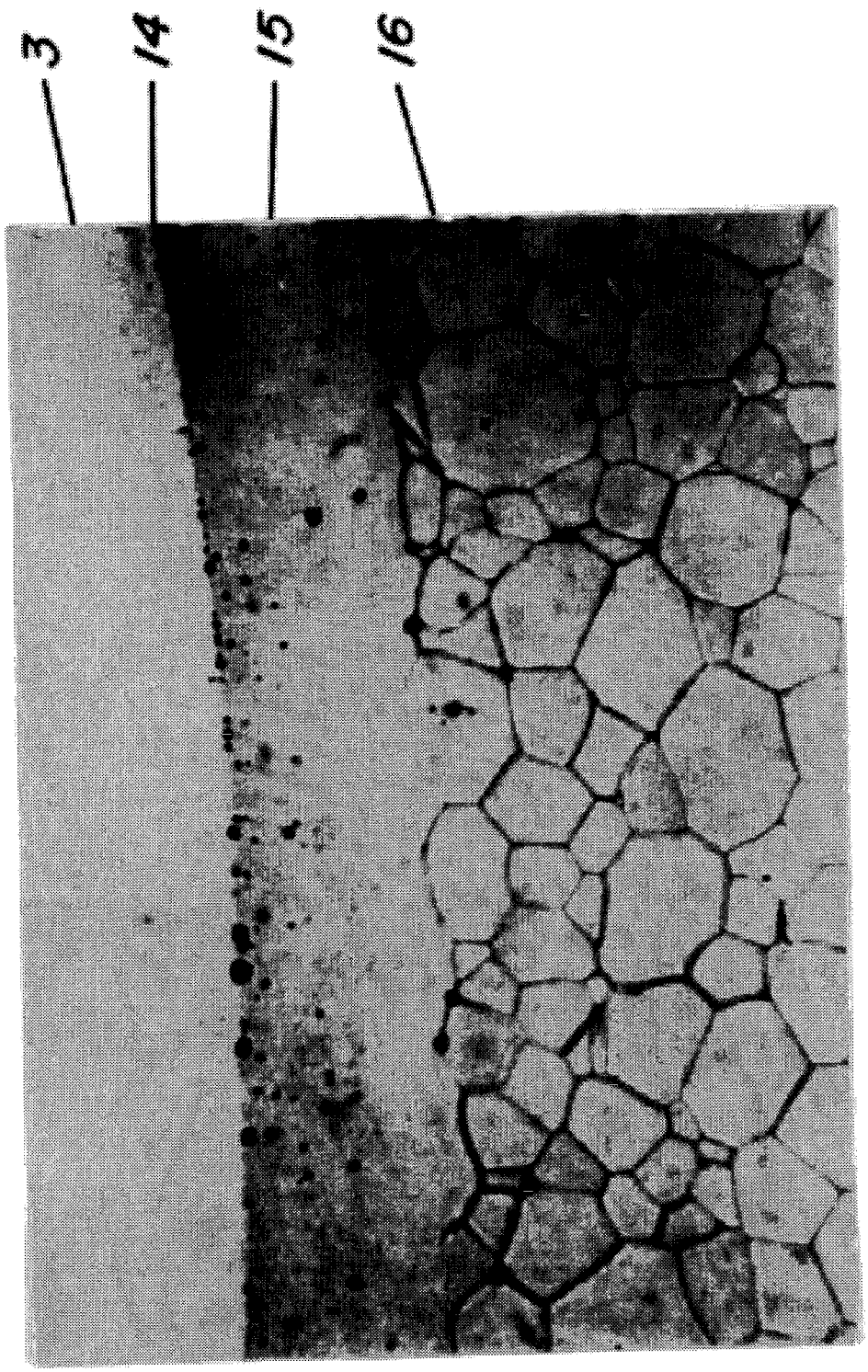
FIG. 2 is an optical micrograph at 200× magnification illustrating the monolithic join between the sapphire seed crystal and the PCA article.

FIG. 2 is a photograph of the monolithic join between the seed crystal and the PCA body. The sapphire seed crystal 3 is shown having an initial interface with remaining pores at 14. Region 15 shows the sapphire growth into the PCA body and region 16 shows the remaining PCA region which has not yet converted to sapphire.

Figure 1B:
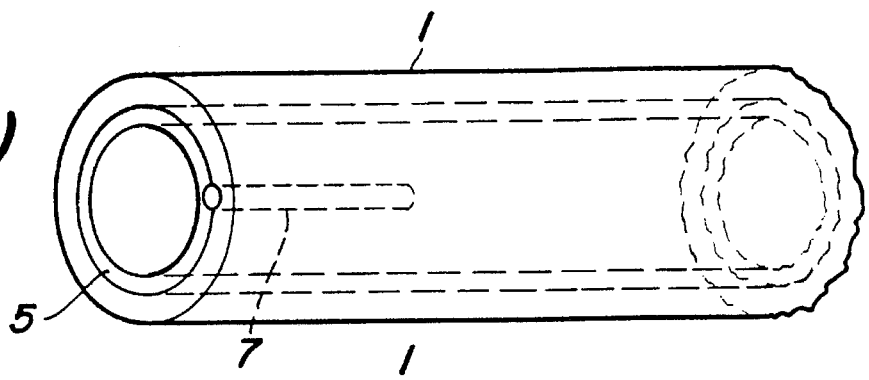

In another embodiment illustrated in FIG. 1(b) there is shown one end of a hollow tube structure comprising sapphire single crystal fiber 7 monolithically joined between two PCA tubes 1 and 5. This structure was formed by inserting the sapphire fiber 7 between a fully sintered inner tube 5 and a partially sintered outer tube 1 and co-firing the structure. The outer tube shrinks to a I.D. of about 1–10% smaller than the O.D. of the inner tube 5. This insures a snug fit between the fiber and the PCA surface.

Figure 1C:
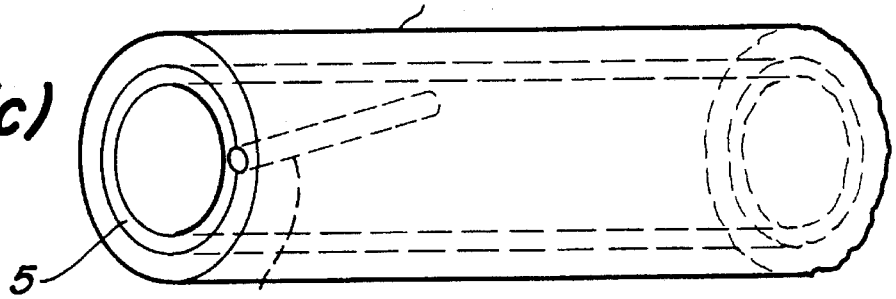

In another embodiment illustrated in FIG. 1(c) seed crystal 9, also in the form of a fiber as in the previous embodiment, is shown at an angle with respect to the longitudinal axis of inner and outer PCA tubes 1 and 5, respectively. Accordingly, the sapphire tubes formed from these embodiments 1(b) and 1(c) will have different crystallographic orientations along the lengths thereof, i.e., the crystallographic orientation will correspond to the direction of the crystal orientation of the sapphire fiber.

Figure 1D:
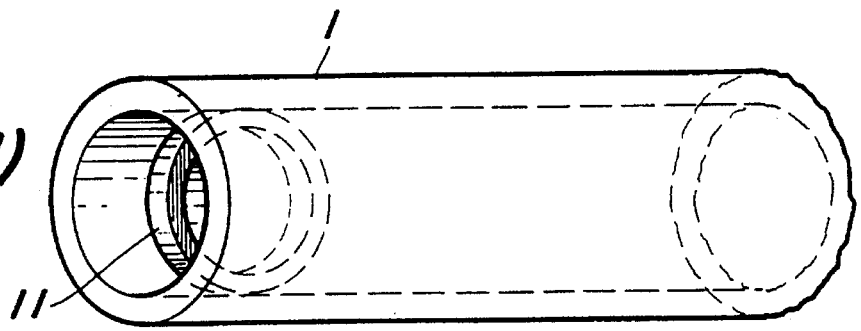

In FIG. 1(d) there is an illustration of another embodiment where the sapphire seed crystal 11 is a ring which can be orientated inside the partially sintered PCA tube 1. The structure is sintered to form a monolithic join at the contact points. Subsequent conversion of the tube to sapphire produces a crystallographic orientation which corresponds to the orientation of the seed ring 11 in the tube 1.

Figure 1E:
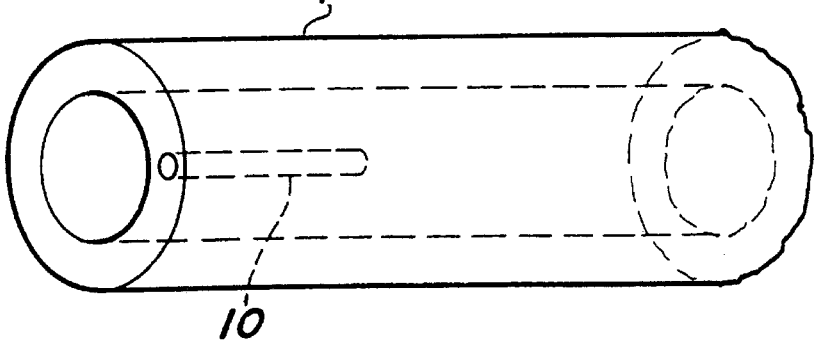

FIG. 1(e) illustrates another embodiment in which a sapphire fiber 10 is used as a seed crystal and is inserted into a hole drilled in a partly sintered PCA tube 1 prior to full sintering and conversion of the PCA tube to sapphire.

Figure 3:
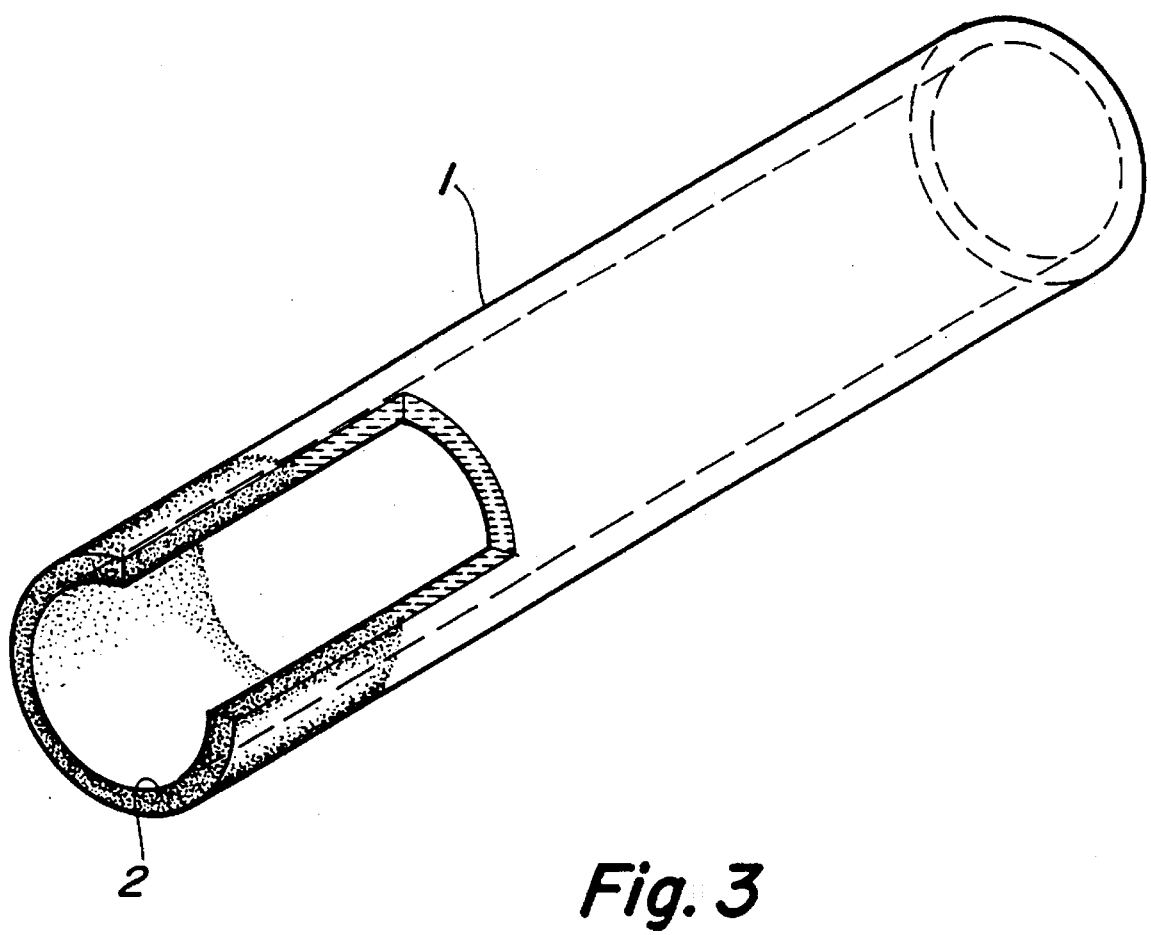
FIG. 3 schematically illustrates an embodiment of thermally forming a seed crystal on the surface of a PCA body.

Alternatively, it is possible to create a seed (sapphire) structure on the PCA by subjecting the surface to a localized heat source such as a laser, plasma torch or oxygen-hydrogen flame. An example of this structure is illustrated in FIG. 3.

Region 2 of the PCA tube 1 has been heated and converted into a localized sapphire seed which is used in the subsequent conversion of the remainder of the tube during heating at a temperature above 1100° C. but below the approximately 2050° C. melting point of alumina.

In fabricating the structure useful in the practice of the invention, the practitioner can start with partially sintered General Electric Company Lucalox® alumina tubing (Part. No. LT 5.5-36-PS) as supplied by the GE Willoughby Quartz Plant, Willoughby, Ohio. The partially sintered material should be processed from a high purity (99.98 wt. %) alumina powder source such as Baikowski CR-10 alumina. It should contain no impurities which would have a significantly deleterious effect on the formation of sapphire. Partially sintered General Electric Lucalox alumina contains between 475–750 wppm of MgO. MgO is added to the alumina as an aid in the elimination of residual porosity during subsequent sintering by preventing the entrapment of pores inside the alumina grains and also to control the PCA grain or crystallite growth in the later stages of sintering making possible the generation of a relatively uniform grain size and an equiaxed grain structure by normal grain growth. The amount of MgO employed in the preparation of a PCA green body to be fired or subsequently heated in contact with the seed crystal can range from about 300 wppm to 1500 wppm, although departures from this amount can occur depending upon the size, shape and thickness of the body and exact firing times and temperatures employed in the process.

Sapphire seed crystals, obtained commercially from Saphikon, Inc., Milford, N.H., or from previously converted sapphire, are placed in contact with the presintered PCA body. Typically a cut ring section of sapphire tubing or rod is placed inside the presintered tube. The combination is sintered in a hydrogen-containing atmosphere having a dew point lower than 20° C. In practice the dew point of the hydrogen ranges from −10° C. to about −110° C. Flowing hydrogen is preferred as is known to those skilled in the art.

The PCA and sapphire seed assembly can also be sintered in other furnace atmospheres including He, $H_2$ and $N_2$ mixtures, or vacuum in order to achieve a fully dense structure.

The partially sintered PCA body is sintered at a temperature ranging from 1700° C. to about 1980° C. and preferably between 1800° C. to 1900° C. in vacuum or $H_2$.

The resulting structure consists of a PCA body having a relatively uniform grain size with an average size ranging from about 15–70 μm and more preferably between 15–50 μm. The density will be greater than 3.90 g/cc and more typically greater than 3.97 g/cc.

By grain size is meant the average dimension of the grain as measured by the well known linear intercept technique as described in ASTM E112-88. A monolithic join is shown by the elimination or prevention of porosity at the sapphire and PCA interface and by grain growth from the sapphire into the PCA region. This structure is shown in FIG. 2.

The magnesium oxide (or magnesia) in the partially sintered Lucalox PCA will be present in an amount of about 300–500 wppm. Since the amount of magnesia present in Lucalox PCA is too great to permit its conversion to sapphire in the process of this invention, the amount of magnesia present must be reduced to a level below 100 wppm, preferably below 50 wppm in order to be able to convert the PCA seeded structure into sapphire.

Those skilled in the art know that magnesium oxide can be driven out of the PCA body by heating in a hydrogen-containing atmosphere, vacuum, or inert gas to a temperature between about 1700°–2000° C. Heating the PCA body to these temperatures to reduce the magnesium oxide content, followed by a cooling down to room temperature, is done slowly to reduce thermal shock and the concomitant cracking of the PCA body. This has been accomplished in a facile manner in an electric resistance sintering furnace with a flowing hydrogen atmosphere in which samples are continuously moving through the furnace. Each cycle comprises about a 15 hour heat up to a temperature of about 1880° C., about 3 hours at the 1880° C. temperature, and then about a 15 hour cool down cycle back to ambient temperature. Hydrogen having a dew point of below 0° C. is preferred. The drier the hydrogen, the less time is required to reduce the MgO. Other times, temperatures and atmospheres can be used to reduce the magnesium content, as is known to those skilled in the art. Thicker wall PCA articles will of course require longer times. General Electric Lucalox® brand hollow PCA tubing having a 5.5 mm O.D. and ½ mm wall thickness required about 9–12 hours at 1880° C. or 3–4 cycles through the furnace to reduce the magnesium oxide level below 50 wppm.

Each cycle employed in reducing the magnesium oxide level increases the grain or crystallite size. When starting with an average grain size of, for example, about 25 microns, the average grain size is between about 40–50 microns by the time the magnesia level is reduced to below 50 wppm and the PCA body starts converting to sapphire.

As set forth above, once the magnesia level has been sufficiently reduced, continued heating or thermal cycling converts the seeded PCA structure to sapphire. To convert a polycrystalline ceramic body to the corresponding single crystal body, the polycrystalline body must be heated above the minimum temperature for grain boundary mobility, but below the melting temperature of the particular material which, for alumina, is about 1100° C. and 2050° C., respectively. In practicing the process of the invention the PCA structure was heated to a temperature at least 1800° C. For example, with reference to the 5.5 mm O.D. thick Lucalox tubing which required 3–4 passes to reduce the level of the magnesia to below 50 wppm, an additional three passes or heat treatments converted the entire tube to sapphire. The three additional heat treatments were identical to those employed to reduce the magnesia level with each treatment involving heating the tube slowly over a period of 15–16 hours from room temperature to 1880° C., holding at 1880° C. for three hours and then slowly cooling back down to room temperature over a period of 15–16 hours. Isothermal heat soaking PCA tubing with a magnesia content below 50 wppm has also resulted in conversion of the tubing to sapphire, but results have not been as good as those achieved with the thermal cycling.

The invention will be further understood with reference to the examples set forth below:

EXAMPLES (1) A partially sintered Lucalox PCA tube was obtained from the General Electric Willoughby Quartz Plant, Willoughby, Ohio (Product No. LT 5.5-36-PS). It had been prefired in air at 1100° C. and was approximately 40–45% dense. When sintered to full density (3.984 g/cc) it will have an outer diameter of 5.5 mm and an inner diameter of 4.5 mm. Sapphire seed crystals were cut from 5.0 mm (outer diameter) sapphire tubing into lengths approximately 0.5 mm long. The 5.0 mm (O.D.) seed rings were inserted into the partially sintered Lucalox PCA tubes. Tubes with the seed were sintered in $H_2$ at 1880° C. The interference fit created by the shrinkage of the PCA tube onto the sapphire seed results in a monolithic type joint providing the initial seeding of the PCA part. The orientation of the sapphire seed was determined using polarized light and compared to a known C-AXIS orientated sapphire crystal.

A second technique for seeding was to use a sapphire fiber of approximately 0.005 inch diameter obtained from Saphikon, Inc., Milford, N.H. A sintered Lucalox PCA tube of 5.5 mm O.D. was inserted into a partially sintered PCA tube which was expected to have a final sintered I.D. of 5.0 mm. The sapphire fiber was inserted between the two tubes.

The seeded parts were fired two different ways. One technique used multiple passes through a continuous type electric resistance flowing hydrogen furnace with samples seeing a peak temperature of about 1880° C. for about 3 hours. Tubes were multiple passed 4 to 10 times to reduce the magnesia level to below 50 ppm and convert the PCA to sapphire. The second method used the same continuous furnace, but the PCA was held in the furnace. In this example the PCA samples were held at 1880° C. for about 24 hours and at 1750° C. for an additional 300 hours. Both of the firing conditions were found to be effective in converting the seeded PCA tubes with lengths as long as 200 mm into sapphire single crystal tubing. The tubes were of the same orientation as the seeded crystal.

Characterization of the sapphire material produced according to this invention was done using scanning electron microscopy, polarized light microscopy, back reflection Laue and Precession method X-ray techniques. Polarized light techniques were used to confirm that the orientation of the seed crystal and the tubes converted to sapphire were the same. Back reflection Laue and Precession method X-Ray techniques were used to confirm that the material produced by the process of the invention was a single crystal.

It is understood that various other modifications will be apparent to and can be readily made by those skilled in the art without departing from the scope and spirit of the invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A solid state process for bulk conversion of a solid PCA body, having a density of at least 3.9 g/cc, to sapphire which comprises monolithically joining said solid PCA body to a solid sapphire seed crystal and heating said PCA body and said seed crystal at a temperature above the minimum temperature for alumina crystal grain boundary mobility, but without melting said PCA body, for a time sufficient to convert said PCA body to a sapphire body.

2. A process according to claim 1 wherein said sapphire body has the same crystal orientation as said seed crystal.

3. A process according to claim 1 wherein said PCA body does not contain grain growth inhibitors in an amount which would prevent grain growth.

4. A process according to claim 1 wherein said PCA comprises alpha alumina.

5. A process according to claim 4 wherein said minimum temperature is above 1100° C.

6. A process according to claim 5 wherein said PCA body contains magnesia prior to said conversion.

7. A process according to claim 6 wherein said magnesia is present in an amount no greater than 100 wppm at the time of said conversion.

8. A process according to claim 7 wherein said conversion temperature is at least 1800° C.

9. A process according to claim 8 wherein said PCA body density is no less than 3.90 g/cc when it converts to sapphire.

10. A process according to claim 8 wherein said heating to said conversion is accomplished by a plurality of thermal cycles.

11. A solid state process for bulk conversion of a PCA body to a sapphire which comprises:

(i) a partially sintered body of alumina containing magnesia in an amount greater than 300 wppm;

(ii) heating said partially sintered body in contact with a sapphire seed crystal of a given crystalline orientation at a temperature above 1700° C. to form a monolithically joined structure;

(iii) heating said structure at a temperature above 1700° C. to reduce the amount of magnesia to below 100 wppm and to achieve a density of at least 3.9 g/cc; and (iv) further heating said structure at a temperature above 1100° C. but below the melting point of said PCA body for a time sufficient to convert said PCA body to a sapphire body having the same crystal orientation as said seed crystal.

12. A solid state process for bulk conversion of a PCA body to sapphire wherein said PCA body comprises alpha alumina having less than 100 wppm magnesia and having a relatively uniform grain size below 70 microns, said process comprising joining said PCA body with a sapphire seed crystal and heating the joined structure at a temperature above 1100° C. for a time sufficient to convert said PCA body to a sapphire body but without causing said PCA body to melt.

* * * * *